(12) United States Patent
Pinarbasi et al.

(10) Patent No.: US 11,600,769 B2
(45) Date of Patent: Mar. 7, 2023

(54) HIGH DENSITY SPIN ORBIT TORQUE MAGNETIC RANDOM ACCESS MEMORY

(71) Applicant: Integrated Silicon Solution, (Cayman) Inc., Grand Cayman (KY)

(72) Inventors: Mustafa Pinarbasi, Morgan Hill, CA (US); Andrew J. Walker, Mountain View, CA (US); Dafna Beery, Palo Alto, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 17/145,126

(22) Filed: Jan. 8, 2021

(65) Prior Publication Data

US 2022/0223787 A1    Jul. 14, 2022

(51) Int. Cl.
| | |
|---|---|
| *G11C 11/16* | (2006.01) |
| *H01L 27/22* | (2006.01) |
| *H01L 43/02* | (2006.01) |
| *H01L 43/08* | (2006.01) |
| *H01L 43/10* | (2006.01) |

(52) U.S. Cl.
CPC .......... *H01L 43/08* (2013.01); *G11C 11/161* (2013.01); *G11C 11/1657* (2013.01); *G11C 11/1673* (2013.01); *G11C 11/1675* (2013.01); *H01L 27/228* (2013.01); *H01L 43/02* (2013.01); *H01L 43/10* (2013.01)

(58) Field of Classification Search
None
See application file for complete search history.

(56) References Cited

U.S. PATENT DOCUMENTS

| | | | | |
|---|---|---|---|---|
| 5,874,760 | A * | 2/1999 | Burns, Jr. ........... | H01L 29/7883 257/E21.652 |
| 11,398,596 | B2 * | 7/2022 | Manipatruni ....... | G11C 11/1659 |
| 2014/0311542 | A1 * | 10/2014 | Yuasa .................... | H01L 37/00 136/205 |
| 2017/0077177 | A1 * | 3/2017 | Shimomura ........ | G11C 11/1675 |
| 2018/0040358 | A1 * | 2/2018 | Noguchi ............... | G11C 11/161 |
| 2020/0082858 | A1 * | 3/2020 | Kim .................. | G11C 11/1659 |
| 2020/0136016 | A1 * | 4/2020 | Lin ......................... | G11C 11/18 |
| 2020/0365308 | A1 * | 11/2020 | Lin ........................ | H01L 43/10 |
| 2021/0202827 | A1 * | 7/2021 | Song .................... | H01L 27/224 |
| 2021/0327960 | A1 * | 10/2021 | Xiao .................... | G11C 11/1675 |

OTHER PUBLICATIONS

PCT Application No. US2022/011202, International Search Report and Written Opinion, 8 pages, dated Jan. 28, 2022.

* cited by examiner

*Primary Examiner* — Ly D Pham

(57) ABSTRACT

A spin orbit torque memory device having a vertical transistor structure. The spin orbit torque memory device includes a magnetic memory element such as a magnetic tunnel junction formed on a spin orbit torque layer. The vertical transistor structure selectively provides an electrical current to the spin orbit torque layer to switch a memory state of the magnetic memory element. The vertical transistor structure accommodates the relatively high electrical current needed to provide spin orbit torque switching while also consuming a small amount of wafer real estate. The vertical transistor structure can include a semiconductor pillar structure surrounded by a gate dielectric layer and a gate structure such that the gate dielectric layer separates the gate structure from the semiconductor pillar.

20 Claims, 15 Drawing Sheets

HIGH DENSITY SPIN ORBIT TORQUE MAGNETIC RANDOM ACCESS MEMORY

FIELD OF THE INVENTION

The present invention relates to a spin orbit torque (SOT) magnetic random access memory (MRAM) and more particularly to an SOT MRAM structure employing a vertical transistor to provide a drive current to a spin orbit torque layer.

BACKGROUND

Random access memory (RAM) is a ubiquitous component of modern digital circuit architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed.

Magnetoresistive Random Access Memory (MRAM) is a non-volatile memory technology having response (read and write) times comparable to volatile memory. Data stored in MRAM does not degrade over time and, compared to other RAM technologies, MRAM uses very little power. In contrast with conventional RAM technologies, which store data as electric charges or current flows, MRAM uses magnetic storage elements. Thus, MRAM has several desirable characteristics that make it a candidate for a universal memory, such as high speed, high density (i.e., small bitcell size), low power consumption, and very little logic state degradation over time.

Despite the characteristics described above, conventional MRAM devices are not perfect. A conventional memory element (e.g., a magnetic tunnel junction (MTJ)) in a spin-transfer-torque MRAM (e.g., a STT-MRAM) is a two-terminal device having shared read and write paths. The shared read and write paths create problems for read speed and write reliability. For writing, the barrier layer in the MTJ should be sufficiently thin (and have relatively low enough resistance) to flow a current necessary for switching. However, a thin barrier layer is more susceptible to dielectric breakdown due to repeated write operations. Also, a state of an MTJ can be flipped unintentionally by a read current. This is called a "read disturbance." As MTJ technology scales down in physical size, switching current tends to decrease. However, high-speed read operations typically require more read current. Therefore, high-speed MRAM, and particularly deeply-scaled MTJ devices, may suffer from a read disturbance. Accordingly, it is challenging to meet reliability requirements for both write endurance (due to strain on a tunnel barrier in the MTJ) and read reliability.

Spin orbit torque based MRAM devices show switching speeds down to about 200 ps, making them usable for L1/L2 cache applications. Another key aspect of these devices is that they do not suffer endurance issues since read and write current paths are separated. The read currents are, in general, an order of magnitude lower than write currents in two terminal MRAM devices. By eliminating the large write switching current SOT memory removes a large stress on the MgO barrier layer, thereby improving reliability and endurance.

Such devices, however, have a data density drawback. First, they are three terminal device and therefore require three transistors. Second, the writing current density through the spin orbit torque material for these structures can be as high as $1-2\times 10^8$ A/cm². This may require switching currents on the order of few hundred micro amps (e.g. about 100-400 micro amp) for generic spin orbit torque layers. This increases the transistor size significantly hence making it very costly. Reducing the cross section of the spin orbit torque layer and the size of the transistor has paramount importance to finding suitable applications.

SUMMARY

The present invention provides a spin orbit torque data recording device that includes a magnetic memory element having a magnetic free layer. An electrically conductive spin orbit torque layer is adjacent to the magnetic free layer of the magnetic memory element. A vertical transistor structure is electrically connected with the spin orbit torque layer and is configured to selectively supply an electrical current to the spin orbit torque layer.

The vertical transistor structure can include a semiconductor pillar and a gate dielectric layer surrounding the semiconductor pillar. An electrically conductive gate layer can be formed adjacent to the gate dielectric such that the gate dielectric layer separates the electrically conductive gate layer from the semiconductor pillar. The semiconductor pillar can be formed to have first and second doped ends that can both be n+ doped regions. The semiconductor pillar structure can be epitaxially grown semiconductor material that can be substantially monocrystalline semiconductor material.

The vertical transistor structure can be a write selector transistor and the data recording device can further include a read selector transistor that can be electrically connected with the magnetic data recording element at an end opposite the spin orbit torque layer.

The magnetic memory element can be a magnetic tunnel junction element. The spin orbit torque layer can be formed of one or more of beta phase tungsten (W) and/or beta phase tantalum (Ta).

Spin orbit torque memory has the advantage of improved durability over other types of magnetic memory, because switching can be performed without repeatedly driving a high current through the magnetic memory element which would stress the barrier layer leading to breakdown of the barrier layer and reduced lifespan and reliability. However, the high current needed to drive switching in a spin orbit torque device also requires a write selector transistor that is sufficiently large and robust to handle the high write currents.

The use of the vertical transistor structure advantageously allows the high current needed for spin orbit torque memory to be supplied to the spin orbit torque layer. The vertical transistor also advantageously provides this high electrical current while consuming a small amount of wafer real estate.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
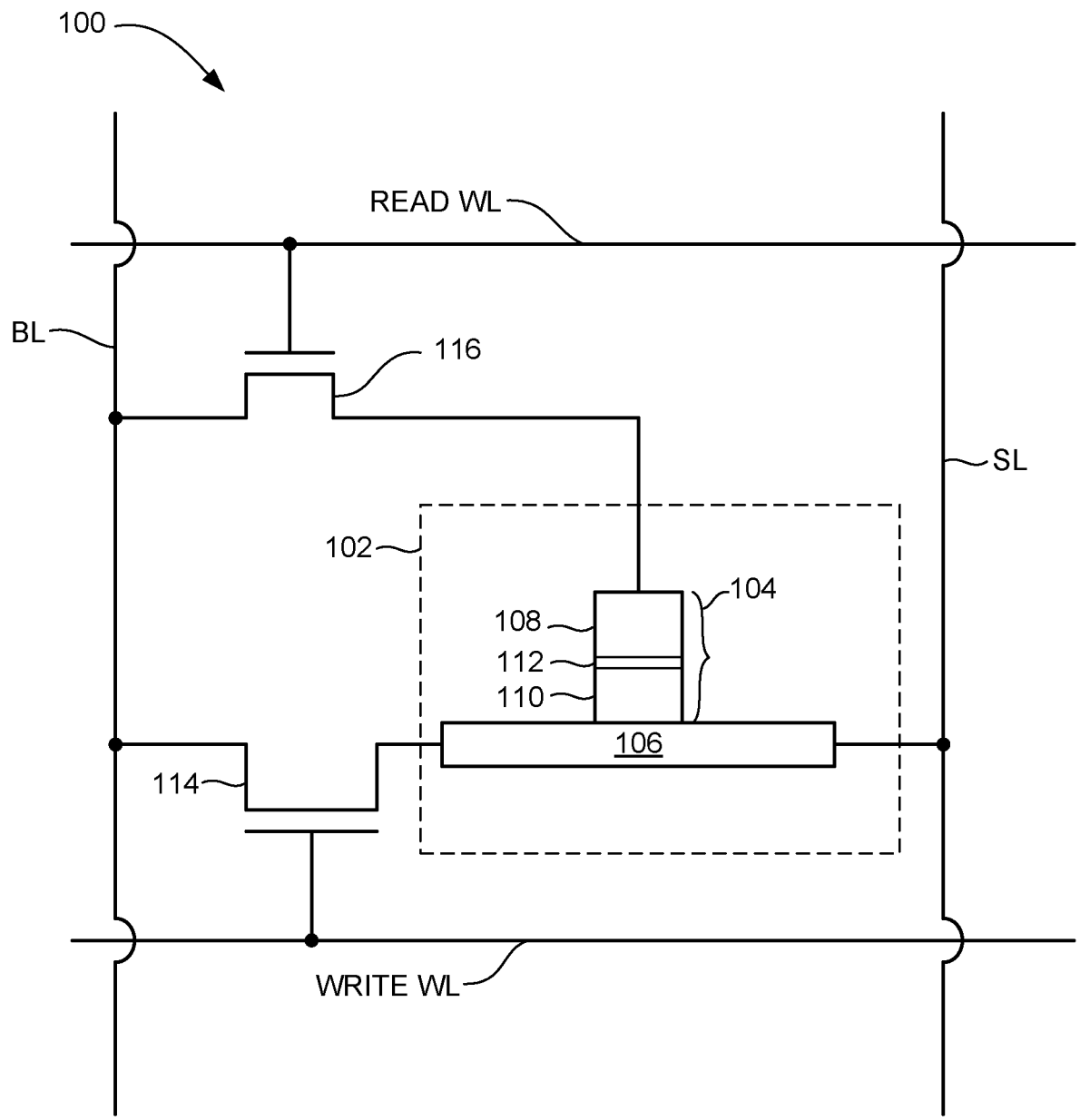
FIG. 1 is an electrical schematic of circuitry for a spin orbit torque magnetic random access memory cell.

FIG. 1 is a schematic illustration of a spin orbit torque memory structure 100 according to one possible embodiment. The memory structure 100 includes spin orbit torque memory element 102 that includes a magnetic memory element 104, which can be a magnetic tunnel junction element (MTJ) and a spin orbit torque layer 106. At its most basic level the MTJ can include a magnetic reference layer 108, a magnetic free layer 110 and a thin, non-magnetic barrier layer 112, which will be described in greater detail herein below. The spin orbit torque layer 106 can be constructed of an electrically conductive metal such as beta phase tungsten (W) and/or beta phase tantalum (Ta). The memory element 102 is a three terminal device that can be electrically connected with a source-line SL and that can be selectively connected with a bit line BL. A pair of transistors 114, 116 can be used to select between a read mode and write mode respectively as will be seen. The transistor 114 is a write transistor, which can be switched on to allow a write current to flow through the spin orbit torque layer 106 between the source line SL and the bit line BL. The mechanism of switching of the memory element 102 will be described in greater detail herein below. The transistor switching device 116 is a read transistor that allows a read current to flow through the magnetic memory element 104 between the bit line and the source line.

Figure 2:
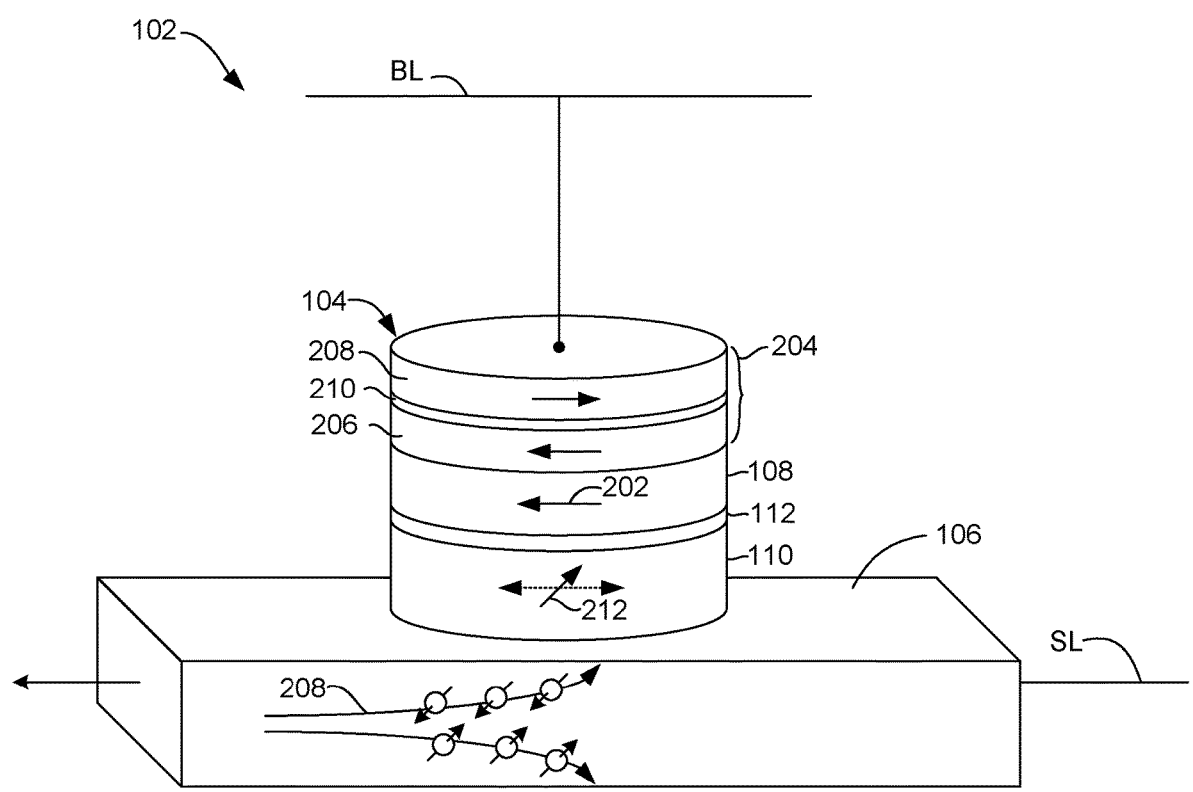
FIG. 2 is a perspective schematic view of a memory element of a spin orbit torque magnetic random access memory system according to an embodiment.

FIG. 2 shows an enlarged perspective, schematic view illustrating the structure and operation of a spin orbit torque memory element 102 according to an embodiment. The memory element structure 102 includes the previously described magnetic memory element 104 which can be a magnetic tunnel junction element. By way of example, the MTJ element 104 can include a magnetic reference layer 108, which can be constructed of a magnetic material such as, but not limited to NiFe, CoFe, etc., and which has a magnetization 202 that is fixed in a predetermined orientation that can be oriented parallel with the plane of the layers as shown in FIG. 2. Pinning of the magnetization 202 of the reference layer 108 can be facilitated by a synthetic antiferromagnetic structure 204, which can include a pair of magnetic layers 206, 208 that are exchange coupled though a non-magnetic coupling layer 210, such as Ru. The magnetic layers 206, 208 are can be anti-parallel exchange coupled, such that the magnetizations of the layers 206, 208 are fixed in opposite directions as shown. Exchange coupling between the synthetic antiferromagnetic structure 204 and the reference layer 108 causes the magnetization 202 of the reference layer 108 to be securely pinned in a desired direction.

The MTJ can also include a magnetic free layer 110 that has a magnetization 212 that can move between magnetic orientations that can also be oriented parallel with the plane of the magnetic free layer 110. The MTJ can be constructed so as to have an in-plane magnetic anisotropy to allow the magnetization 212 to switch between two orientations and then remain stable in that orientation. The magnetization 212 of the magnetic free layer 110 can be canted in a quiescent state in order to facilitate switching between two states.

Switching of the magnetization 212 between the two stable magnetic states can be accomplished by spin orbit coupling from the spin orbit torque layer 106. When an electrical current flows through the layer 106, the spin orbit of electrons through the spin orbit torque layer 106 becomes aligned as shown by line 208, with electrons at a top of the layer 106 being aligned in a first direction and electrons at the bottom of the layer 106 being oriented in an opposite direction. The spin-oriented electrons at the top surface of the layer 106 provide a force on the magnetization 212 of the free layer 110 that causes the magnetization 212 to switch to a desired orientation. Switching the magnetization 212 to the opposite direction can be accomplished by generating a current in an opposite direction through the spin orbit torque layer 106.

The use of the spin orbit torque layer 106 to switch the magnetization 212 of the magnetic free layer 110 improves switching speed and endurance in a memory system. Switching without the use of a spin orbit torque layer requires the application of a high switching current directly through the memory element 104 in a direction perpendicular to the plane of the layers. This imposes a high thermal stress on the barrier layer 112, which can cause the barrier layer to break down, thereby reducing the life of the memory element. In addition, spin orbit torque switching provides improvement in switching speeds as compared with other switching mechanisms. For example, spin orbit torque based MRAM devices can exhibit switching speeds down to about 200 picoseconds (ps), making them usable for L1/L2 cache applications.

One challenge presented by spin orbit torque MRAM systems is the high amount of current needed through the spin orbit torque layer 106 to cause desired switching of the magnetization 212 of the free layer 110. This high amount of current requires a correspondingly large selector transistor. Using current, traditional transistor would require a large amount of wafer area to be able to handle the high current loads and would, therefore, reduce the density of a memory system using such technology.

According to an embodiment, this challenge can be overcome through the use of a vertical, epitaxial selector transistor. With reference to the schematic illustration of FIG. 1, the selector transistor 114, which is shown schematically in FIG. 1 can be constructed as a vertical transistor structure, which can handle high current loads while consuming less area than a traditional transistor structure. The other selector transistor 116 could also be constructed as a vertical transistor structure. However, since this transistor 116 does not need to handle the high current loads of transistor 114, the transistor 116 need not be constructed as a vertical transistor structure.

Figure 3:
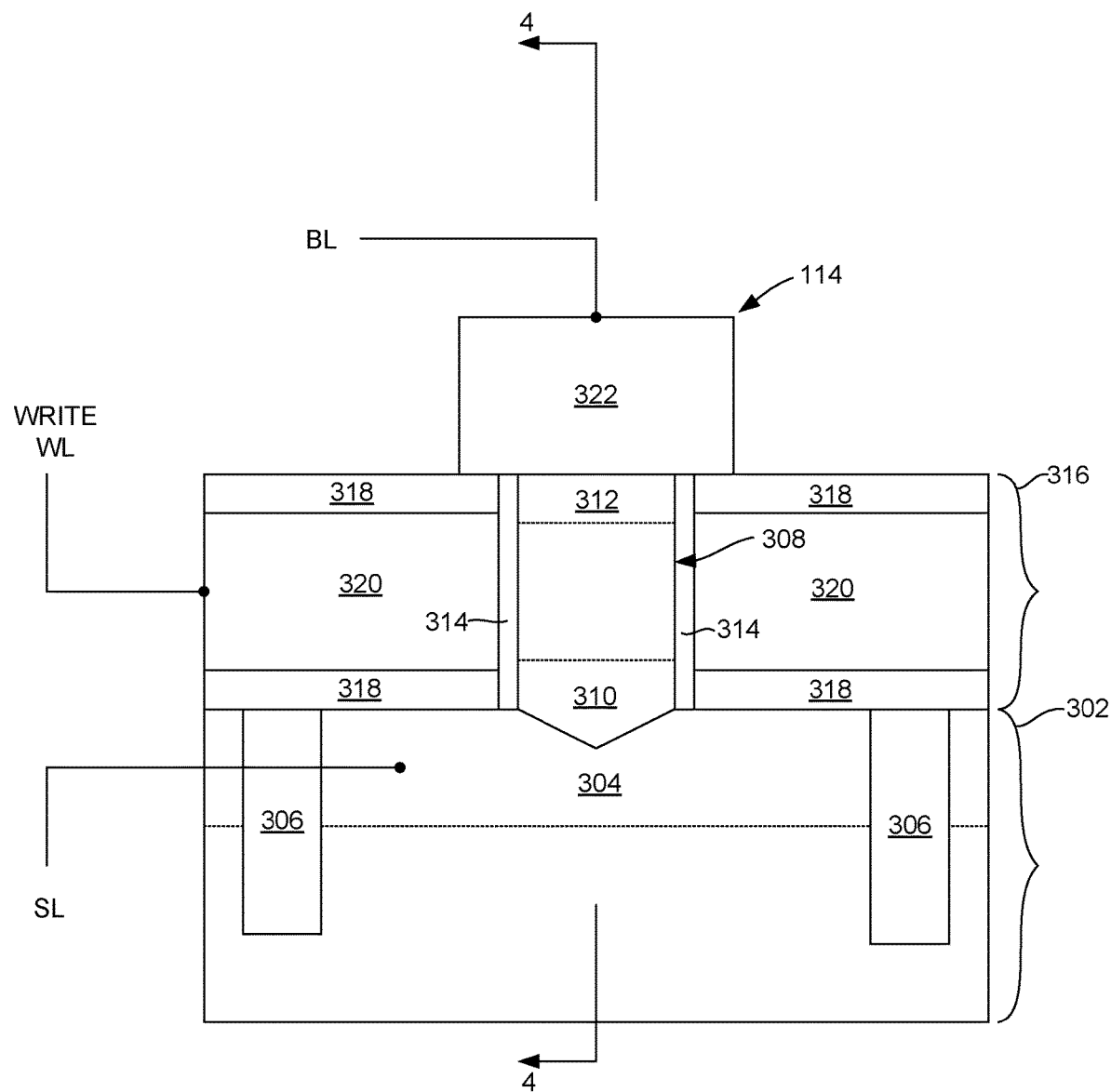
FIG. 3 is a cross sectional view of a vertical transistor structure according to an embodiment.
Figure 4:
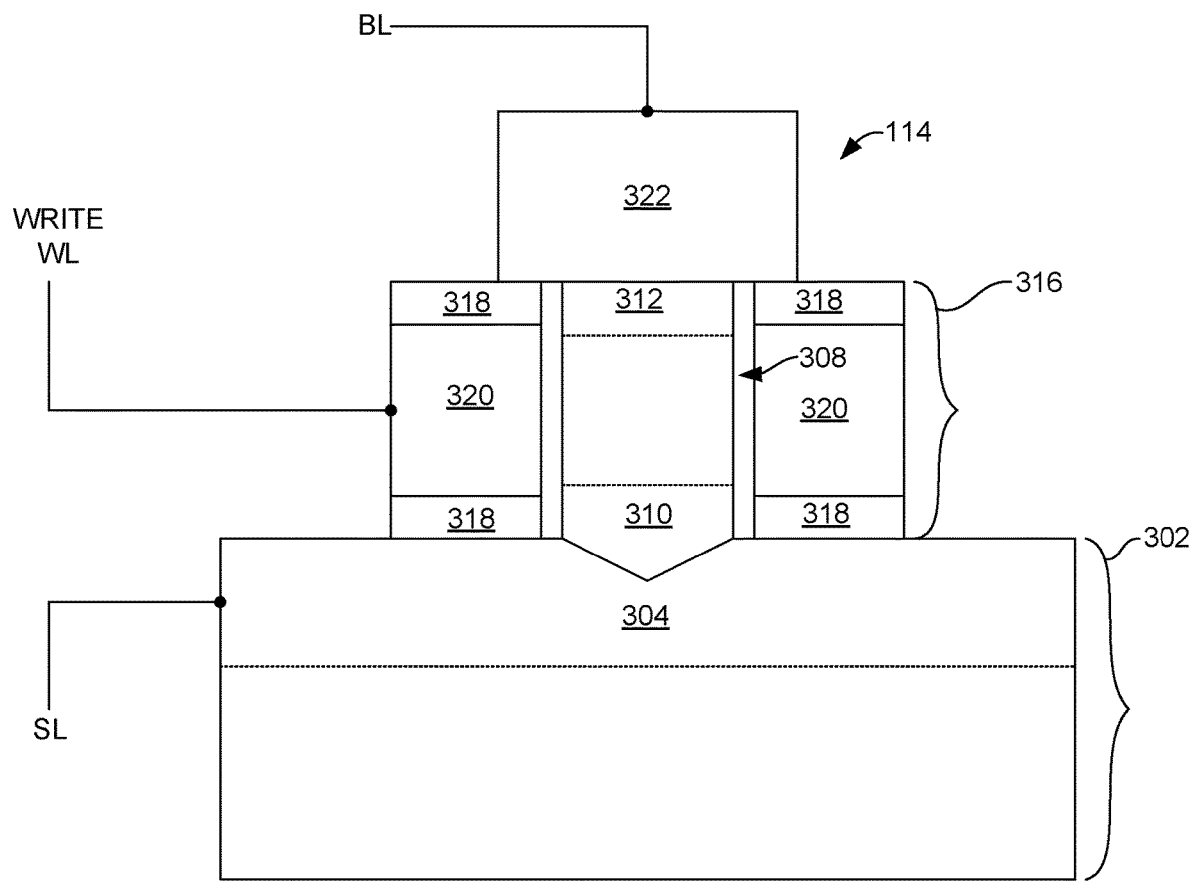
FIG. 4 is a cross sectional view of the vertical transistor structure as seen from line 4-4 of FIG. 3.

FIGS. 3 and 4 show cross-sectional views of a transistor structure 114 according to an embodiment. FIG. 3 is a cross sectional view along a plane that is parallel with a word line structure (WRITE WL), and FIG. 4 is a cross sectional view as seen from line 4-4 of FIG. 3. The selector transistor structure 114 is formed on a semiconductor substrate 302 that is preferably a silicon substrate, but could also be some other semiconductor material. The semiconductor substrate 302 includes an upper portion that can be doped to form an electrically conductive source line layer 304. The source line layer 304 can be divided into individual source line structures by dielectric trench isolation structures 306 which can be constructed of an oxide such as silicon oxide or a nitride.

A semiconductor pillar 308 is formed over the source line layer 304 on the substrate 302. The semiconductor pillar is preferably an epitaxially grown semiconductor such as Si or SiGe. Epitaxially grown semiconductor material has been found to possess good crystallographic properties, which possess excellent properties for conducting electrical current. A method for constructing such an epitaxial semiconductor pillar 308 will be described in greater detail herein below. The semiconductor pillar 308 can be formed with doped regions 310, 312 at the bottom and top portions of the pillar 308. The doped portions 310, 312 can be n+ doped by implantation, annealing etc., and provide a source and drain for the vertical semiconductor structure 114.

The semiconductor pillar 308 is surrounded by a gate dielectric layer 314 and a gate structure 316, such that the gate dielectric layer 314 surrounds the pillar 308 and separates the semiconductor pillar 314 from the gate structure 316. The gate structure can include upper and lower dielectric layers 318, and an electrically conductive gate line layer 320 located between the upper and lower dielectric layers 318. The upper and lower dielectric layers 318 can be constructed of an oxide or nitride, and the electrically conductive gate layer 320 can be constructed of, for example, highly doped semiconductor material such as highly doped silicon. An electrically conductive lead 322 can be formed over the top end (opposite the source-line layer 304) to provide electrical connection between the semiconductor pillar 308 and the bit-line (BL).

The semiconductor pillar 308 can be in the form of a cylindrical pillar, but could have other shapes as well. For example, the semiconductor pillar could have an elongated elliptical or oval shape when viewed from above, or could be formed as a rectangular prism when viewed from above in FIGS. 3 and 4. As shown in FIGS. 3 and 4, the bottom of the semiconductor pillar 308 can have a beveled bottom. This can be advantageous during formation of the pillar 308 as will be further explained herein below. The semiconductor pillar 308 along with the gate dielectric layer 314 and the gate structure 316 form a vertical CMOS selector transistor structure with the bottom 310 and top 312 being source and drain regions. When a gate voltage is applied across the gate dielectric layer from the electrically conductive gate layer 320 the pillar 308 becomes electrically conductive, allowing electrical current to flow between the source line layer 304 and the bit line layer BL. Conversely, when the gate voltage is removed, the semiconductor pillar 308 becomes electrically insulating, preventing the flow of electrical current between the source-line layer 304 and the bit line BL.

Figure 5:
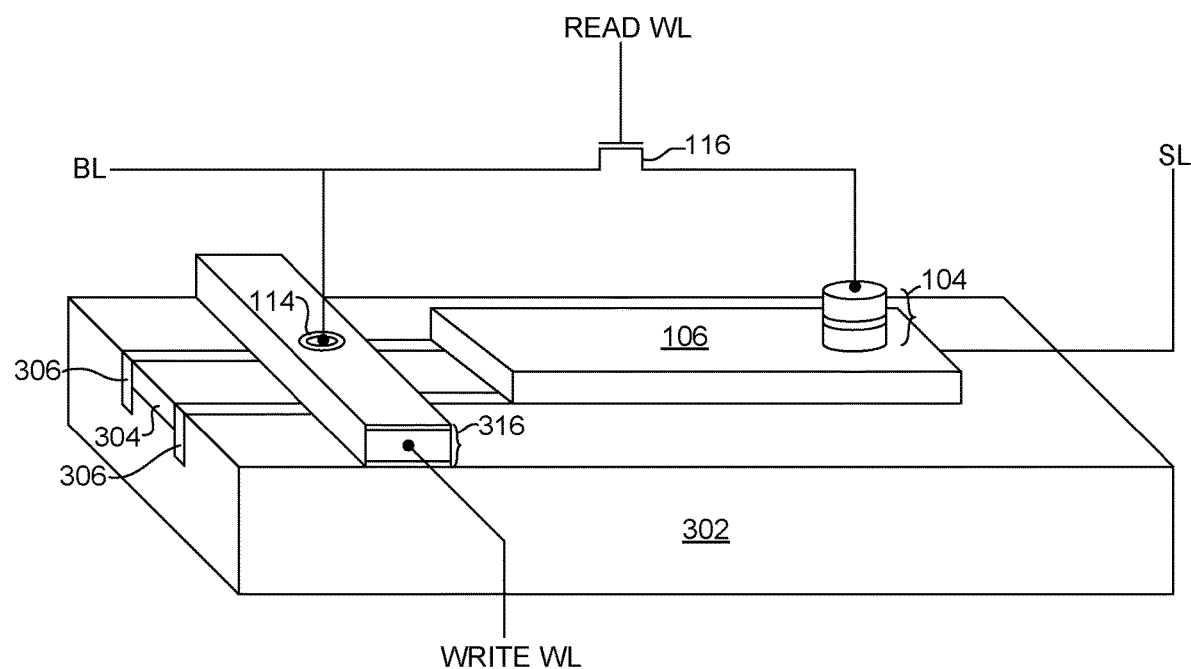
FIG. 5 is a perspective, schematic view of a spin orbit torque magnetic random access memory structure employing a vertical transistor structure electrically connected with a spin orbit torque magnetic random access memory element.

FIG. 5 is a perspective schematic illustration of a spin orbit torque MRAM structure that employs a vertical transistor structure 114 such as described above. As seen in FIG. 5, the bit line BL is connected with a read selector transistor 116, which connects the bit-line BL to a magnetic memory element 104, which can be a Magnetic Tunnel Junction element (MTJ). The bit-line BL is also connected the vertical selector transistor 114. The vertical selector transistor 114 is a write word line selector that selectively connects the bit-line BL with the source line layer 304.

During read mode the read transistor 116 is open and the transistor 114 is closed. The read transistor 116 is controlled by a signal from the read word line WL which provides a gate voltage to the read transistor 116. The memory state of the memory element 104 can be read by applying a voltage across the memory element between the bit-line BL and the source line SL.

During a write mode, the write selector transistor 114 is open, thereby connecting the bit-line BL with the source-line SL through the source-line layer 304 formed in the substrate. The write selector transistor is controlled by a gate voltage applied by the write word line (WRITE WL). This causes an electrical current to flow through the spin orbit torque layer 106. As previously described, when an electrical current flows through the spin orbit torque layer 106 electrons become spin polarized in opposite direction at the top and bottom of the layer 106. This polarization of electron spin causes the magnetization of the free layer of the memory element 104 to be set in a desired direction that depends on the direction of current flow through the spin orbit torque layer 106.

Figure 6:
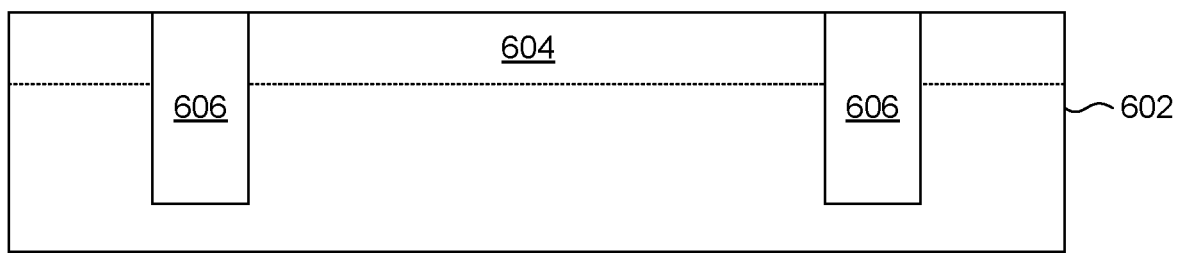
FIGS. 6-15 show a portion of a spin orbit torque memory structure in various intermediate stages of manufacture in order to illustrate a possible method for manufacturing a spin orbit torque structure employing a vertical transistor.

The vertical semiconductor structure 114 can advantageously handle higher current loads than traditional transistor structures, and can do so while consuming a small amount of area on the substrate 302. These advantages are further enhanced when the semiconductor pillar is formed by epitaxial growth on the substrate. FIGS. 6-16 are views of a portion of a spin orbit torque MRAM system in various intermediate stages of manufacture in order to illustrate a method for manufacturing a spin orbit torque MRAM structure with a vertical transistor structure. With particular reference to FIG. 6, a semiconductor substrate 602 is provided. The substrate 602 can be a silicon wafer or could be another type of semiconductor material such as SiGe. An upper portion 604 of the substrate 602 can be doped (e.g. n+ doped) to form a highly doped source layer. Doping can be performed by ion implantation or in-situ deposition of doped semiconductor material. Optionally, dielectric trench isolation structures 606 can be formed to separate the doped upper portions 604 into individual source layers. The trench isolation structures 606 can be formed by etching to form a trench and depositing a dielectric material such as silicon oxide or silicon nitride. A chemical mechanical polishing process can be performed to planarize the upper surface of the wafer doped source regions 604 and trench isolation structures 606.

Figure 7:
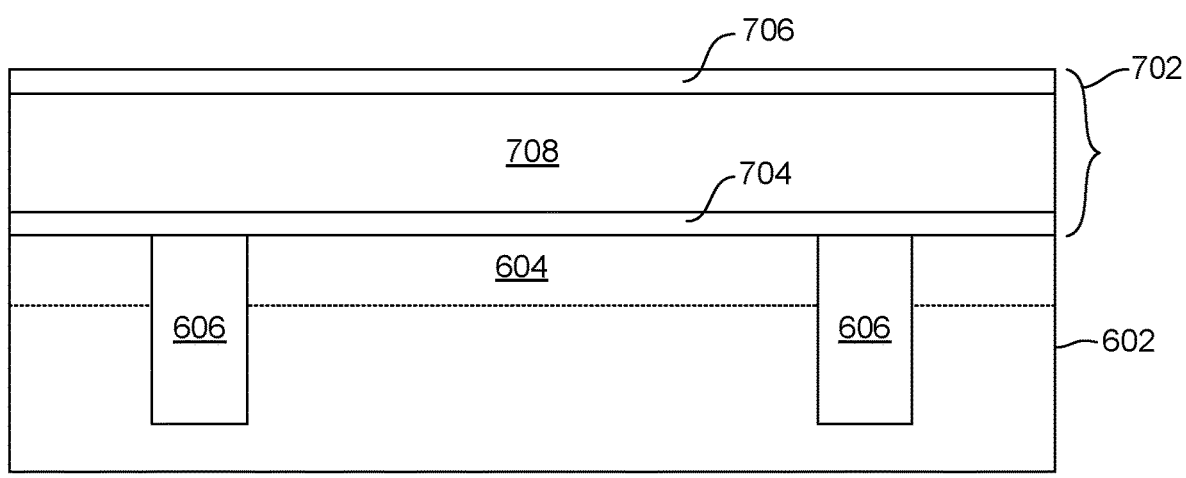

With reference now to FIG. 7, a series of layers are deposited to form a gate structure 702. The gate structure 702 includes an electrically conductive gate layer 708 located between first and second dielectric gate dielectric layers 704, 706. The electrically conductive gate layer 708 can be a highly doped semiconductor such as highly doped silicon or could be some other type of electrically conductive material. The first and second dielectric layers 704, 708 can be an oxide or nitride such as silicon oxide or silicon nitride.

Figure 8:
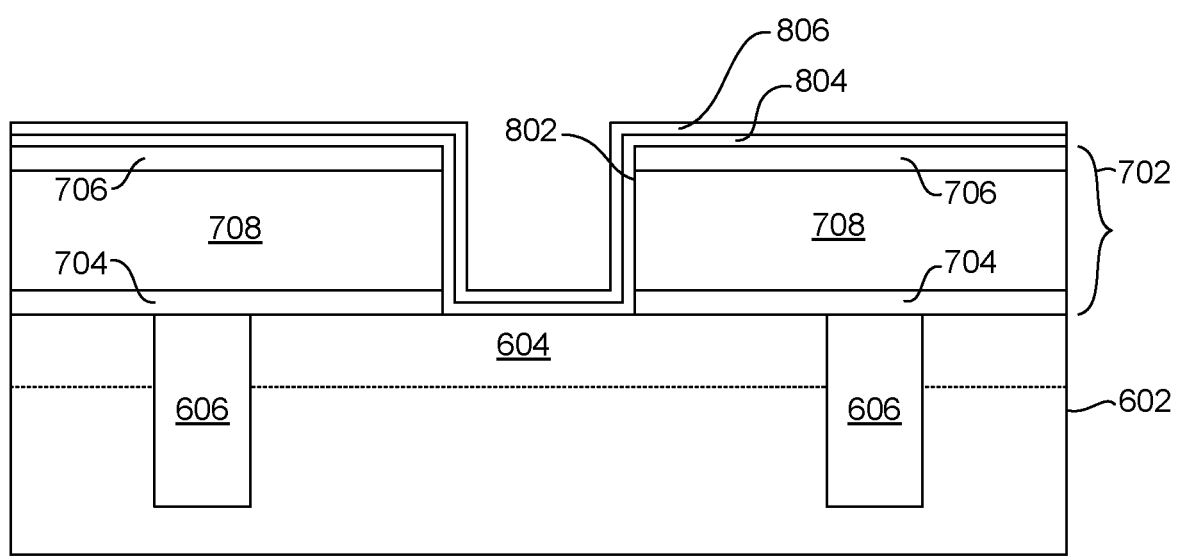

With reference now to FIG. 8, an opening 802 is formed in the layers 704, 708, 706, stopping at the doped source layer 604 of the substrate 602. The opening can be configured to have a shape that will define a silicon pillar structure, and could be round oval, rectangular etc. as desired. The opening 802 can be formed by a masking and etching process. A gate dielectric layer 804 is then deposited, followed by a protective layer 806. The gate dielectric layer can be a material such as silicon oxide or silicon nitride and is deposited to have a thickness at the side of the opening 802 that will provide a desired spacing between a semiconductor pillar (not yet formed) and the electrically conductive gate layer 708. The protective layer can be a material that is chosen to have a etch selectivity with the gate dielectric layer 804, such that the protective layer 806 can be removed by an etching chemistry that leaves the gate dielectric layer 804 substantially intact. The gate dielectric layer 804 and protective layer 806 can be deposited by a conformal deposition process such as atomic layer deposition (ALD), chemical vapor deposition (CVD) etc.

Figure 9:
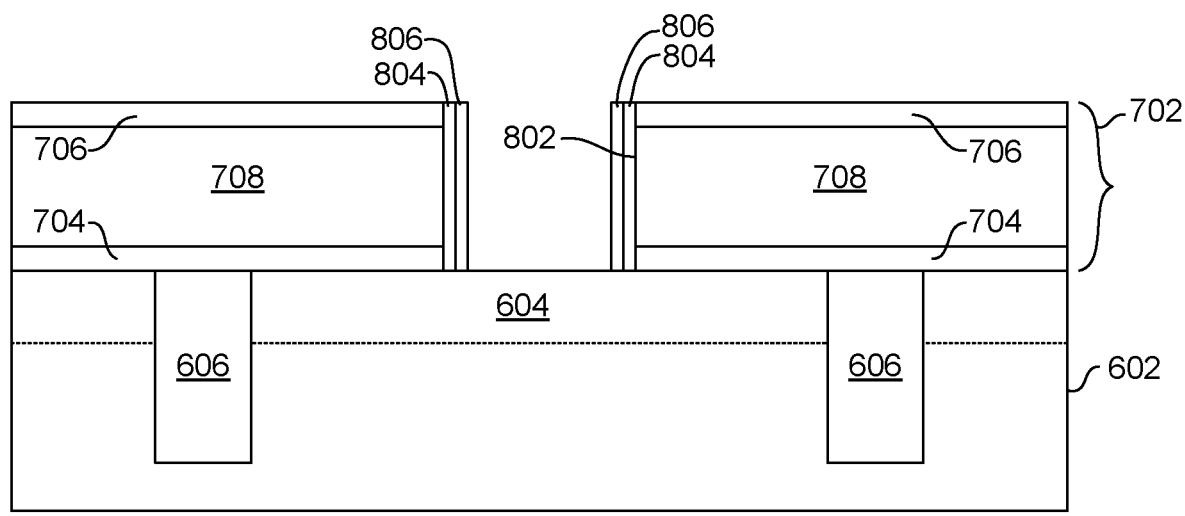

With reference now to FIG. 9, an anisotropic material removal process such as ion milling is performed to preferentially remove horizontally disposed portions of the layers 804, 806, opening up that bottom of the opening 802 to expose the underlying source-line layer 604. This material removal process leaves the gate dielectric layer 804 and protective layer 806 on the inner side of the opening 802. The protective layer 806 protects the gate dielectric layer 804 during this material removal process (e.g. ion milling).

Figure 10:
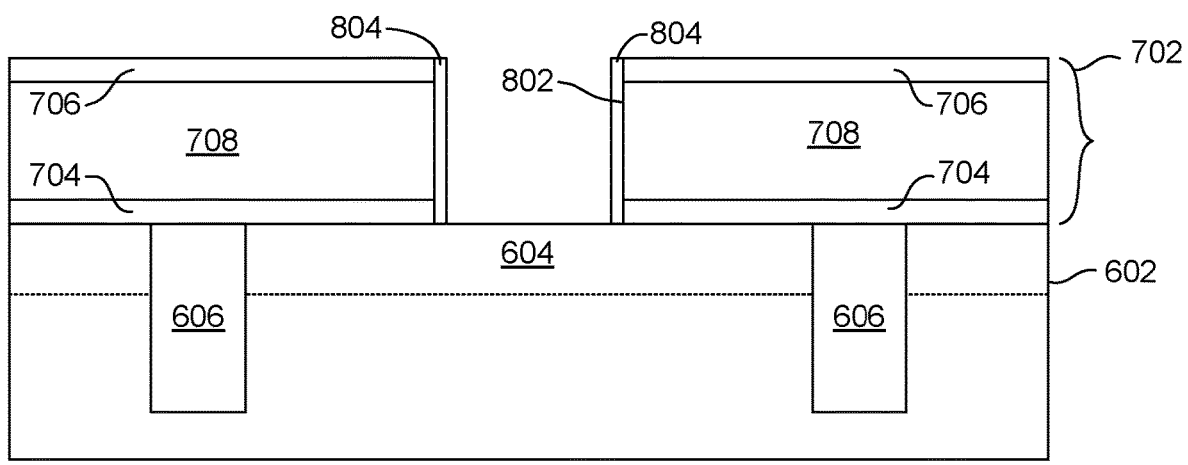

With reference now to FIG. 10, a selective etching is performed to remove the protective layer 806 leaving the gate dielectric layer 804 on the inner side of the opening 802. This selective etching can be reactive ion etching and can be performed using a chemistry that is chosen to remove the protective layer 806 without significantly removing the gate dielectric layer 804.

Figure 11:
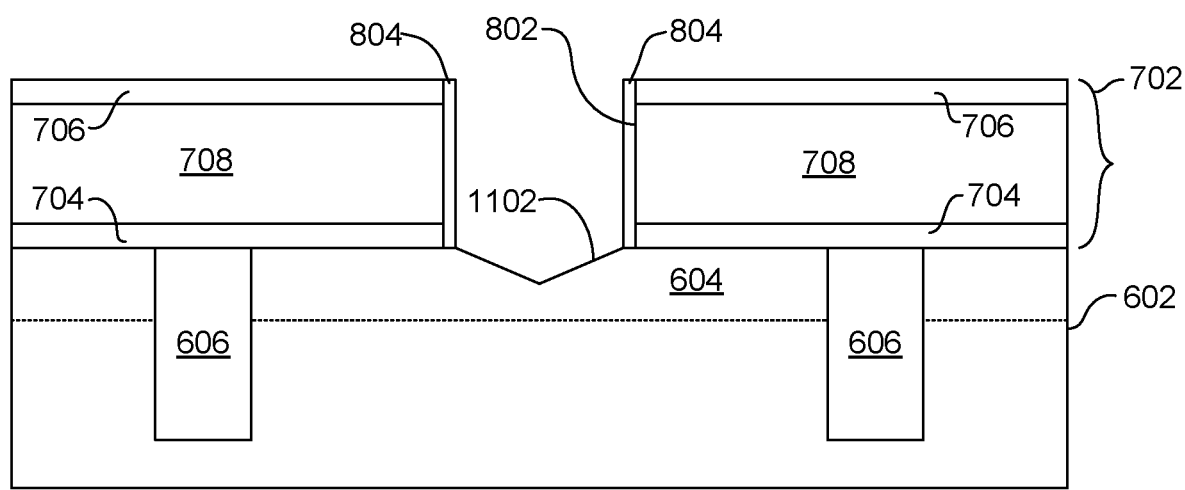

With reference to FIG. 11, a further etching process can be performed to remove a portion of the doped source-line layer 604. This etching can be performed in a manner that forms a beveled surface 1102 on the exposed source layer 604 as shown in FIG. 11. This has been found to promote good crystalline growth during a later epitaxial semiconductor deposition.

Figure 12:
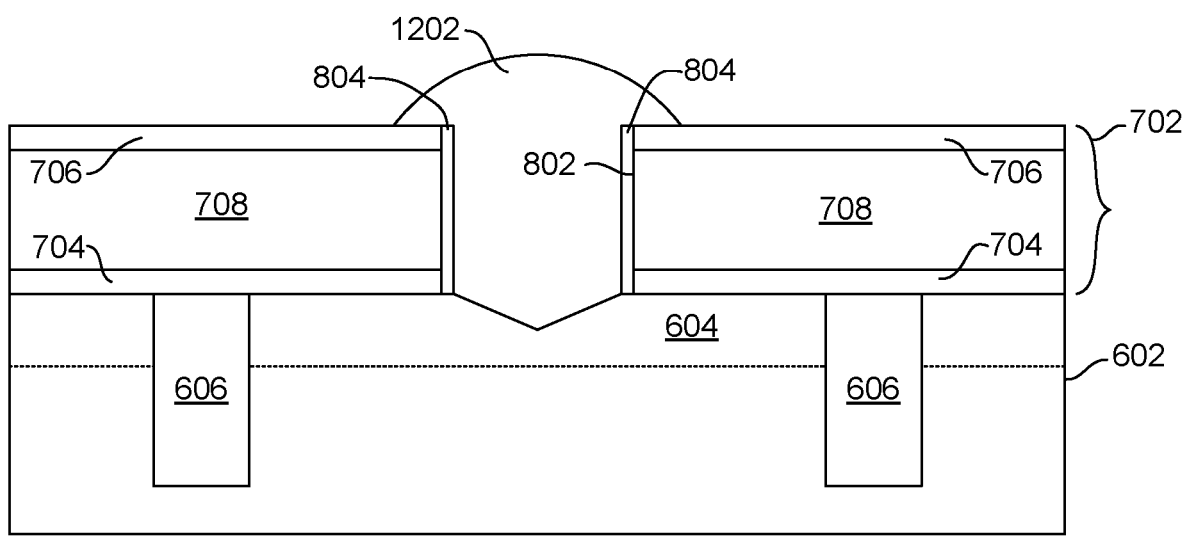

With reference now to FIG. 12, a semiconductor material is grown in the opening 802. The semiconductor 1202 can be Si, SiGe etc. and is preferably grown using selective epitaxial growth. Epitaxial growth of the semiconductor material 1202 provides good crystalline properties in the semiconductor material 1202. As mentioned above, the beveled shape of the source line layer 604 at the bottom of the opening 802 further promotes excellent crystallographic properties in the epitaxially grown semiconductor material 1202. As a result, the semiconductor material 1202 can have a monocrystalline or nearly monocrystalline structure, which results in low resistance in a finished transistor structure, allowing the transistor to accommodate high current loads needed for driving a switching current in a spin orbit torque MRAM system. As can be seen in FIG. 12, the deposition or growth of the semiconductor material can leave a portion of the semiconductor material extending out of the opening 802. Alternatively, the semiconductor growth can be terminated before the semiconductor material 1202 reaches the top of the opening which can be followed by deposition of doped semiconductor material, as will be seen.

Figure 13:
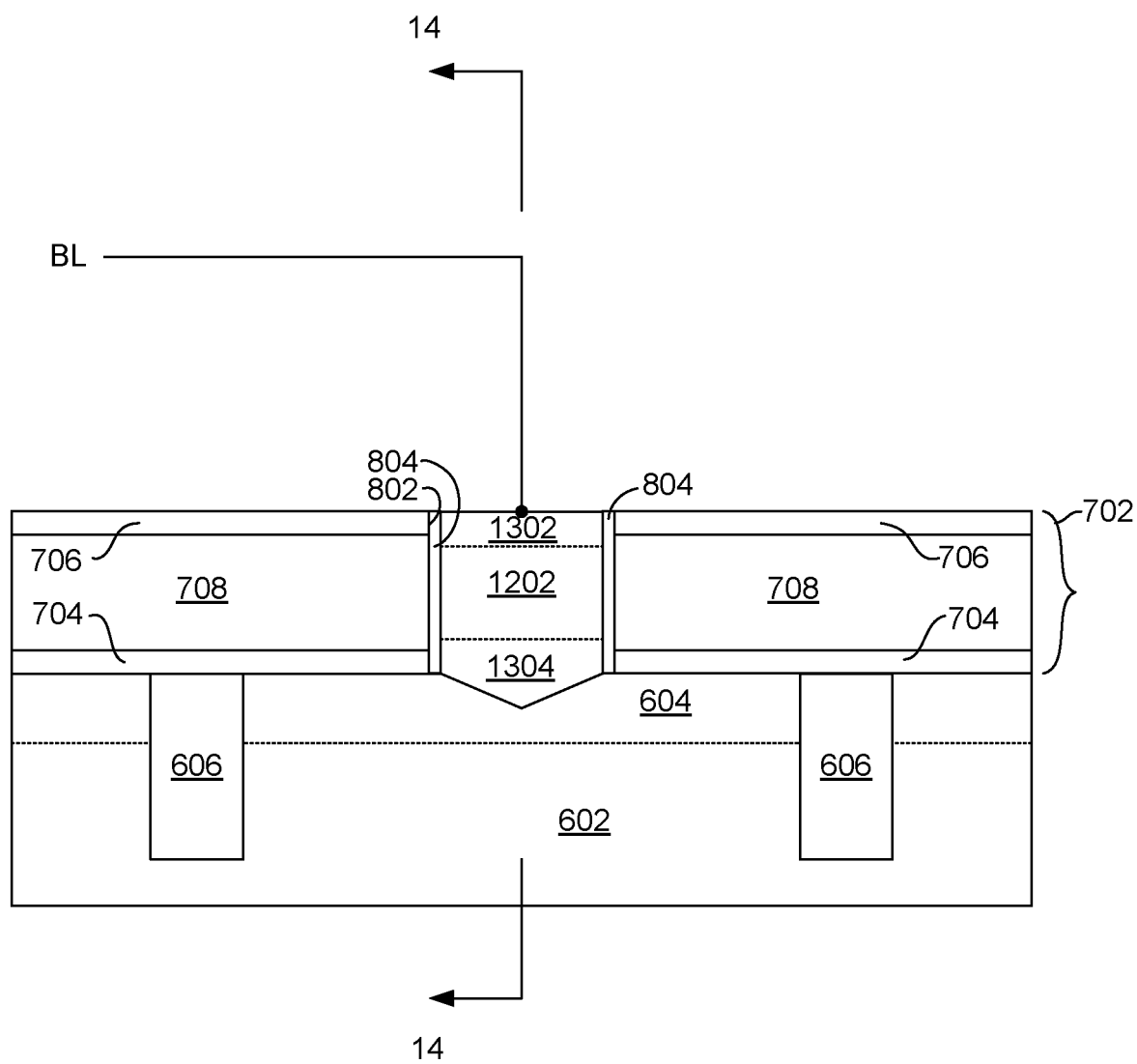

With reference now to FIG. 13, a chemical mechanical polishing process can be performed to planarize the semiconductor material 1202 by removing any semiconductor material that extends out of the opening 802, leaving a semiconductor pillar 1202 as shown in FIG. 13. In addition, upper and lower portions of the semiconductor pillar 1202 can be doped to form upper and lower doped semiconductor regions 1302, 1304. The lower doped portion 1304 can be doped by annealing to cause dopant atoms from the source line layer 604 to diffuse into the lower portion 1304 of the semiconductor material. The upper portion 1302 of the semiconductor pillar 1202 can be doped by ion implantation. Alternatively, the upper portion 1302 of the semiconductor pillar 1202 can be doped by terminating the epitaxial growth of the semiconductor material 1202 prior to reaching the top of the opening 802 and then performing an in-situ deposition of doped semiconductor material. The doped regions 1302, 1304 can be n+ doped. The doped regions 1302, 1304 form source and drains for a semiconductor channel. After forming the semiconductor pillar 1202 and doped source and drain regions 1302, 1304 the upper end of the semiconductor pillar 1202 can be connected with the bit line circuitry BL.

Figure 14:
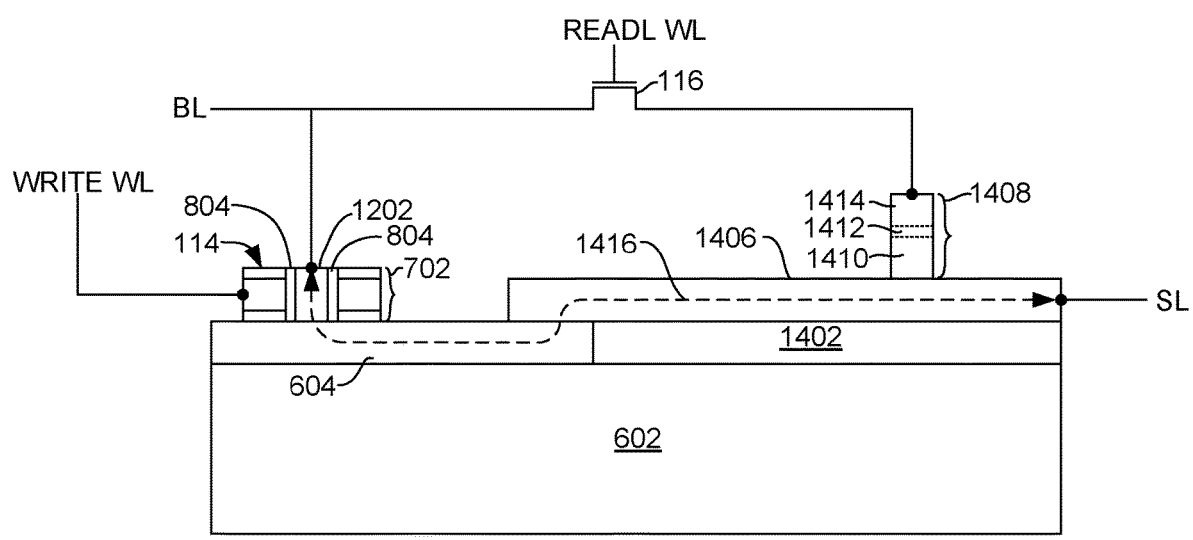

FIG. 14, shows an expanded, cross-sectional view as seen from line 14-14 of FIG. 13. As shown in FIG. 14, a dielectric layer 1402 can be formed on the substrate 602 to extend from an end 1404 of the source line layer 604. A spin orbit torque layer 1406 can be formed over the dielectric layer 1402 and overlapping a portion of the source line layer 604. The spin orbit torque layer 1406 can be formed of an electrically conductive metal such as beta phase tungsten (W) or beta phase tantalum (Ta). A magnetic memory element 1408 is formed over the spin orbit torque layer 1406. The magnetic memory element 1408 can be an MTJ memory element as previously described and can include a magnetic free layer 1410, non-magnetic barrier layer 1412 and magnetic reference layer 1414, with the magnetic free layer being adjacent to the spin orbit torque layer 1406.

The previously described semiconductor pillar structure 1202 gate dielectric 804 and gate structure 702 form a write selector transistor 114 such as previously described above with reference to FIG. 1. The gate structure 702 can be connected with write word line (WRITE WL) circuitry. As shown, the write selector transistor 114 is electrically connected with bit line circuitry BL and with the spin orbit torque layer 1406 via the source line layer 604. A read transistor 116 is also connected with bit line circuitry BL and with an end of the magnetic memory element 1408, similar to the schematic illustration previously discussed with reference to FIG. 1.

During a writing operation, a voltage applied by the WRITE WL circuitry opens the write transistor 114, allowing electrical current to flow between the bit line BL and source line circuitry SL through the spin orbit torque layer 1406 as indicated by the dashed line 1416. In a write state, the read selector transistor is switched to an off state. As previously discussed, the flow of electrical current results in a spin polarization of electrons at upper and lower surfaces of the spin orbit torque layer 1406. This spin polarization can be used to apply a spin orbit torque to the free layer 1410 of the memory element 1408 to selectively set the magnetization of the magnetic free layer 1410 in a desired orientation. The orientation of the magnetization of the magnetic free layer 1410 can be switched in one of two directions depending upon the direction of current flow through the spin orbit torque layer 1406. As previously discussed, setting the magnetization of the free layer 1410 in one direction sets the magnetic memory element 1408 in a high resistance state and in the opposite direction sets the magnetic memory element 1410 in a low resistance state. In this way, the memory element securely records a bit of date depending on the its resistance state.

In a read mode, the write selector transistor 114 is switched to an off state, and the read selector transistor 116 is switched to an on state, allowing electrical connection between the bit line BL and the memory element 1408. The read selector transistor 116 is controlled by read word line circuitry (READ WL) which can selectively apply a gate voltage to the read selector transistor 116. When the read selector transistor 116 is switched on, a voltage can be applied across the magnetic memory element 1408 between the bit line BL and the source line SL, which can be used to determine the resistance state of the magnetic memory element.

Figure 15:
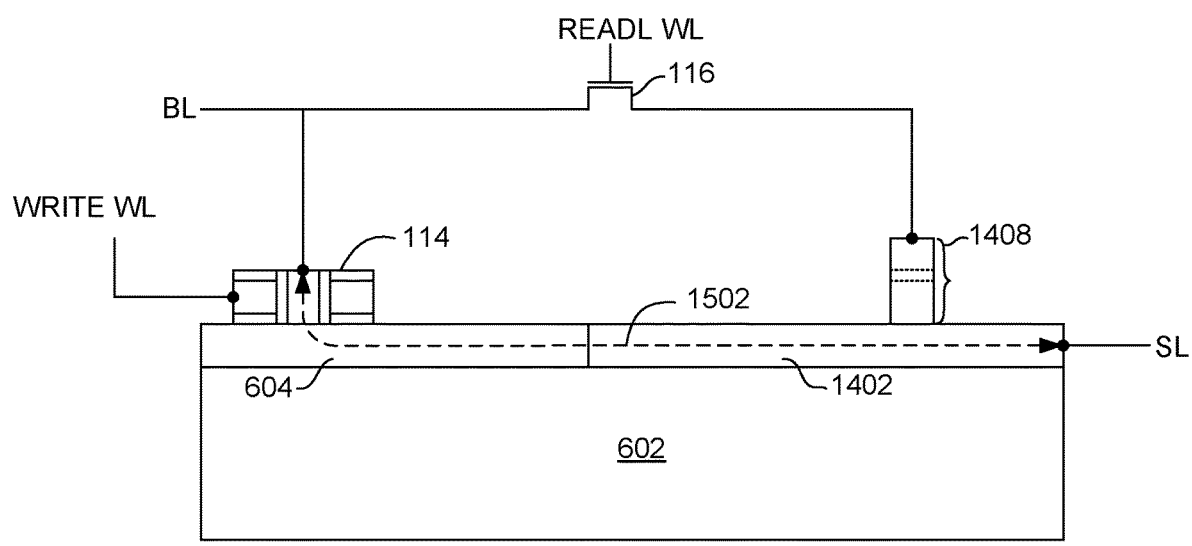

FIG. 15 illustrates a spin orbit torque MRAM according to an alternate embodiment. The embodiment of FIG. 15 is similar to that described above, except that the spin orbit torque layer 1406 abuts the source layer 604 rather than overlapping the source line layer 604. This could be achieved by etching into the source line layer 604 and depositing an electrically conductive spin orbit torque layer, followed by a chemical mechanical polishing process to planarize the structure before forming the selector transistor 114 and magnetic memory element 1408. In this embodiment, during a write operation, current flows from the source line layer 604 to the spin orbit torque layer and then to source line circuitry SL as indicated by arrow 1502.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A data recording device, comprising:
   a magnetic memory element having a magnetic free layer;
   an electrically conductive spin orbit torque layer formed on a substrate and isolated from the substrate by a dielectric layer, the magnetic memory element being formed on the spin orbit torque layer with the magnetic free layer being formed directly adjacent the spin orbit torque layer;
   an electrically conductive source line layer being formed on or in the substrate and adjacent the dielectric layer, the spin orbit torque layer overlapping a portion of the source line layer and the source line layer being electrically connected to the spin orbit torque layer by the overlapping portion of the spin orbit torque layer; and
   a vertical transistor structure formed on the source line layer and being electrically connected to the source line layer, the vertical transistor structure being configured to selectively supply an electrical current to the spin orbit torque layer.

2. The data recording device as in claim 1, wherein the vertical transistor structure further comprises:
   a semiconductor pillar formed on the substrate;
   a gate dielectric layer surrounding the semiconductor pillar; and
   an electrically conductive gate layer adjacent to the gate dielectric layer such that the gate dielectric layer separates the electrically conductive gate layer from the semiconductor pillar.

3. The data recording device as in claim 2, wherein the semiconductor pillar has first and second doped end portions.

4. The data recording device as in claim 2, wherein the semiconductor pillar structure has first and second n+ doped portions.

5. The data recording device as in claim 2, wherein the semiconductor pillar structure comprises epitaxially grown semiconductor material.

6. The data recording device as in claim 2, wherein the semiconductor pillar comprises substantially monocrystalline semiconductor material.

7. The data recording device as in claim 1, wherein the vertical transistor structure is a write selector transistor, and the data recording device further comprises a read selector transistor that is electrically connected with the magnetic memory element.

8. The data recording device as in claim 7, wherein the read selector transistor is connected with the magnetic memory element at an end opposite the spin orbit torque layer.

9. The data recording device as in claim 1, wherein the magnetic memory element is a magnetic tunnel junction element.

10. The data recording device as in claim 7, further comprising an electrically conductive bit line that is electrically connected with the read transistor and the write transistor, and wherein the spin orbit torque layer is electrically connected with the magnetic memory element.

11. The data recording device as in claim 10, further comprising write word line circuitry electrically connected with the electrically conductive gate layer.

12. The data recording device as in claim 1, wherein the spin orbit torque layer comprises one or more of beta phase W or beta phase Ta.

13. A data recording device, comprising:
   a semiconductor substrate;
   a source line layer formed in the semiconductor substrate;
   a vertical transistor structure formed on the source line layer and electrically and directly connected with the source line layer formed in the substrate;
   a spin orbit torque layer formed in the substrate and abutting the source line layer to set up a direct and electrical connection with the source line layer within the substrate; and
   a magnetic memory element formed on the spin orbit torque layer.

14. The data recording device as in claim 13, wherein the magnetic memory element is a magnetic tunnel junction element.

15. The data recording device as in claim 13, wherein the magnetic memory element is a magnetic tunnel junction element that includes a magnetic free layer, and wherein the magnetic free layer is adjacent to the spin orbit torque layer.

16. The data recording device as in claim 13, wherein the magnetic spin orbit torque layer comprises one or more of beta phase W or beta phase Ta.

17. The data recording device as in claim 13, wherein the vertical transistor structure further comprises:
   a semiconductor pillar having upper and lower doped regions;
   a gate dielectric layer formed at a side of the semiconductor pillar; and
   a gate structure formed such that the gate dielectric layer separates the gate structure from the semiconductor pillar.

18. The data recording device as in claim 17, wherein the gate dielectric layer surrounds the semiconductor pillar and the gate structure further comprises an electrically conductive layer located between first and second dielectric layers.

19. The data recording device as in claim 18, further comprising write word line circuitry electrically connected with the electrically conductive layer of the gate structure.

20. The data recording device as in claim 19, further comprising a read transistor and an electrically conductive bit line electrically connected with the vertical transistor structure and the read transistor.

\* \* \* \* \*